United States Patent
Ghosh et al.

(10) Patent No.: US 9,441,952 B2
(45) Date of Patent: Sep. 13, 2016

(54) METROLOGY TOOL FOR ELECTROLESS COPPER THICKNESS MEASUREMENT FOR BBUL PROCESS DEVELOPMENT MONITORING

(71) Applicants: Nilanjan Ghosh, Chandler, AZ (US); Zhiyong Wang, Chandler, AZ (US); Yu-Chun Chen, Chandler, AZ (US); Shuhong Liu, Chandler, AZ (US)

(72) Inventors: Nilanjan Ghosh, Chandler, AZ (US); Zhiyong Wang, Chandler, AZ (US); Yu-Chun Chen, Chandler, AZ (US); Shuhong Liu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/040,178

(22) Filed: Sep. 27, 2013

(65) Prior Publication Data

US 2015/0092201 A1  Apr. 2, 2015

(51) Int. Cl.
*G01B 11/06* (2006.01)
*G01B 11/02* (2006.01)
*H05K 3/46* (2006.01)

(52) U.S. Cl.
CPC ........ *G01B 11/0625* (2013.01); *G01B 11/026* (2013.01); *H01L 2224/16146* (2013.01); *H01L 2224/73204* (2013.01); *H01L 2924/12042* (2013.01); *H05K 3/4644* (2013.01); *H05K 2203/163* (2013.01)

(58) Field of Classification Search
CPC .... G01B 11/02; G01B 11/06; G01B 11/0625
USPC ........................................ 356/630
See application file for complete search history.

(56) References Cited

U.S. PATENT DOCUMENTS 6,586,822 B1 * 7/2003 Vu et al. ............ 257/678
2012/0099116 A1 * 4/2012 Seo ............... 356/612

* cited by examiner

*Primary Examiner* — Tarifur Chowdhury
*Assistant Examiner* — Omar Nixon
(74) *Attorney, Agent, or Firm* — Blakely, Sokoloff, Taylor & Zafman LLP

(57) ABSTRACT

A method including measuring a first distance to a surface of an integrated circuit substrate or a portion of an integrated circuit package by measuring an angle to it from two known points; introducing a material onto the surface; measuring a second distance to a surface of the film from the two known points; and determining a thickness of the introduced material by subtracting the second distance from the first distance.

16 Claims, 5 Drawing Sheets

METROLOGY TOOL FOR ELECTROLESS COPPER THICKNESS MEASUREMENT FOR BBUL PROCESS DEVELOPMENT MONITORING

BACKGROUND

1. Field

Metrology and circuitry.

2. Description of Related Art

Microelectronic packaging technology, including methods to mechanically and electrically attach a silicon die (e.g., a microprocessor) to a substrate or other carrier continues to be refined and improved. Bumpless build-up layer (BBUL) packaging technology is one approach to a packaging architecture. Among its advantages, BBUL packaging technology eliminates the need for assembly, eliminates prior solder ball interconnections (e.g., flip-chip interconnections), reduces stress on interlayer dielectric of die due to die-to-substrate coefficient of thermal expansion (CTE) mismatch and reduces package inductance through elimination of core and flip-chip interconnect for improved input/output (I/O) and power delivery performance.

Typical of BBUL packaging technology is a die or dice embedded in a substrate such as a bismaleimide-triazine (BZT) laminate which has one or more build-up layers formed thereon. A process such as laser drilling and plating may be used for via formation to contacts on the die or dice. Build-up layers of, for example, alternating layers of dielectric (insulating) material and conductive material (e.g., traces or lines). Dielectric material is typically applied as a film and conductive material is applied and patterned by way of an electroless seeding process followed by electroplating of a conductor material such as copper.

Accurately measuring a thickness of an electrolessly introduced seed material such as copper is important for process control and minimization of yield losses during BBUL process development.

DETAILED DESCRIPTION

Figure 1:
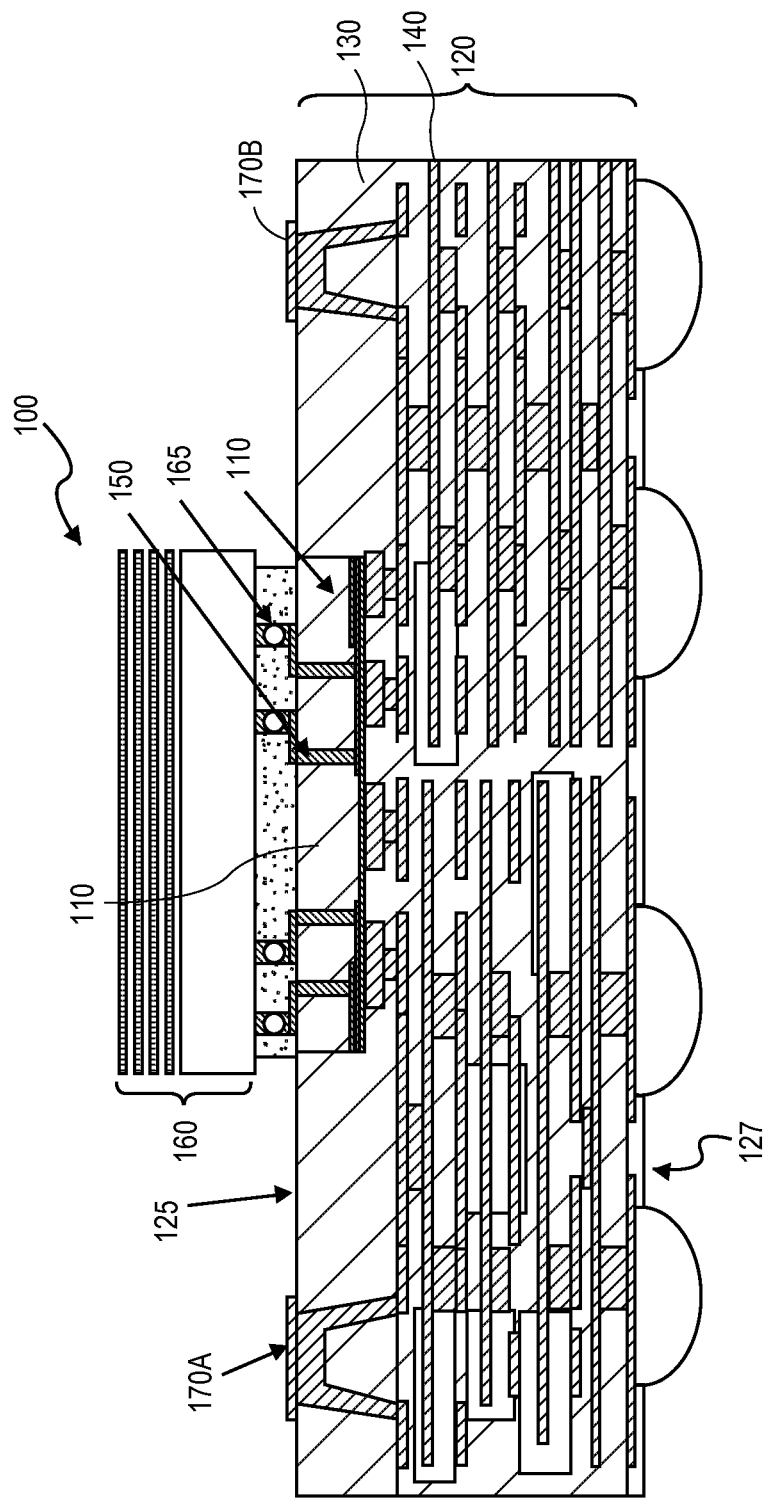
FIG. 1 shows a cross-sectional side view of an embodiment of a microelectronic package.

FIG. 1 shows a cross-sectional side view of a microelectronic package according to one embodiment. As illustrated in FIG. 1, microelectronic package 100 utilizes bumpless build-up layer (BBUL) packaging technology. Microelectronic package 100 includes carrier 120 having surface 125 and opposing surface 127. Die 110, such as a microprocessor die, is embedded in carrier 120 of surface 125. In one embodiment, die 110 is a silicon die or the like having a thickness of approximately 150 micrometers (μm). Another example, die 110 can be silicon die or the like that is a thickness less than 150 μm such as 50 μm to 150 μm. It is appreciated that other thicknesses for die 110 are possible.

Referring to FIG. 1, die 110 and carrier 120 are in direct physical contact with each other (e.g., there are no solder bumps connecting die 110 to carrier 120). Die 110 is directly connected to carrier 120 at its device side (device side down as viewed). Carrier 120 includes multiple build-up layers including dielectric layers 130 and conductive layers 140 (connected with conductive vias or the like) that provide connectivity to the die (power, ground, input/output, etc.).

In the embodiment shown in FIG. 1, die 110 is a through-silicon via (TSV) die. FIG. 1 shows die 110 having conductive vias 150 that extend from a device side of die to the contacts on a back side of the die. In this manner, a second device such as a logic device or memory device or several devices (stacked devices) may be connected to die 110 through the contacts on the back side of the die (e.g., wide I/O configuration). FIG. 1 shows memory or logic die or stack memory/logic die 160 connected to contacts on a back side of die 110 through logic-memory interface (LMI) or logic-logic interface (LLI) 165.

In addition to the ability to connect a secondary device to the back side of die 100, in the embodiment shown in FIG. 1, microelectronic package 100 includes contacts 170A and 170B on surface 125 of carrier 120. It is appreciated that contacts 170A and 170B are individual contacts representative of possibly many contacts that surround a periphery of carrier 120 to make contact with a secondary device. Contact 170A and contact 170B are connected to vias 120. Contact 170A and contact 170B are available for connection to a secondary device such as a memory device or microprocessor (possibly encompassed in a package). In the situation where the secondary device is a package that is connected to microelectronic package 100, a package on package (POP) configuration is described.

Referring to carrier 120, as noted above, the carrier is made of multiple layers or levels of patterned conductive material such as copper and is separated from adjacent layers by dielectric material.

Referring to FIG. 1, die 110 and carrier 120 are in direct physical contact with each other (e.g., there are no solder bumps connecting die 110 to carrier 120). Die 110 is directly connected to carrier 120 at its device side (device side down as viewed). Carrier 120 includes multiple build-up layers including dielectric layers 130 and conductive layers 140 (connected with conductive vias or the like) that provide connectivity to the die (power, ground, input/output, etc.).

In the embodiment shown in FIG. 1, die 110 is representatively a through-silicon via (TSV) die. FIG. 1 shows die 110 having conductive vias 150 that extend from a device side of die to the contacts on a back side of the die. In this manner, a second device such as a logic device or memory device or several devices (stacked devices) may be connected to die 110 through the contacts on the back side of the die (e.g., a wide I/O configuration). FIG. 1 shows memory or logic die or stack memory/logic die 160 connected to contacts on a back side of die 110 through logic-memory interface (LMI) or logic-logic interface (LLI) 165.

In addition to an ability to connect a secondary device to the back side of die 100, in the embodiment shown in FIG. 1, microelectronic package 100 includes contacts 170A and 170B on surface 125 of carrier 120. It is appreciated that contacts 170A and 170B are individual contacts representative of possibly many contacts that surround a periphery of carrier 120 to make contact with a secondary device. Contact 170A and contact 170B are connected to vias 120. Contact 170A and contact 170B are available for connection to a secondary device such as a memory device or microprocessor (possibly encompassed in a package). In the situation where the secondary device is a package that is connected to microelectronic package 100, a package on package (POP) configuration is described.

Referring to carrier 120, as noted above, the carrier is made of multiple layers or levels of patterned conductive material such as copper and is separated from adjacent layers by dielectric material. Typically, a dielectric material such as an ABF material is introduced as a film or sheet. Conductive vias are then introduced through the sheet by, for example, a laser drilling process. The vias are desmeared and then a conductive seed material is introduced in the vias and over a surface of the substrate (e.g., a blanket deposition or introduction). A sacrificial material such as a photoimageable material (e.g., a photoresist) is introduced and patterned for desired traces or lines of conductive material. Following patterning of the photoimageable material, a conductive material such as copper is electroplated to areas with exposed seed material to form traces and into the vias and conductive vias to form conductive vias. After forming the conductive traces (e.g., copper traces) and conductive vias, the sacrificial material is removed as is excess seed material leaving the conductive traces and lines on the dielectric film. Representatively, the excess seed material is removed by flash etching.

Introducing a seed material such as an electroless deposition of a copper seed material to a targeted thickness is important and impacts the BBUL assembly process as a thickness will effect downstream operations. A representative target thickness of an electroless copper seed layer is on the order of 0.6 µm to 1.2 µm. If such seed material is introduced or deposited to a thickness greater than, for example, 1.2 µm there is an additional cost associated with both the deposition and the removal of the excess material. In addition, since the processes are set, for example, for a target of 0.6 to 1.2 microns, a flash etch to remove excess material may not remove all excess seed material that was introduced to a greater thickness which presents the issue of potential shorts. If a seed material is introduced to a thickness less than a targeted thickness (e.g., less than 0.6 µm), the process of removal of excess seed material (e.g., flash etch) might undercut an underlying dielectric film. Accordingly, it is desirable that a seed layer be introduced to a targeted thickness. Verification of such thickness through metrology is likewise important.

In one embodiment, a methodology of measurement for determining a thickness of a seed layer utilizes triangulation. Triangulation is a process of determining a location of a point by measuring angles to it from known points at either end of a fixed baseline. The point to be located can then be fixed as the third point of a triangle with one known side and two known angles.

Figure 2:
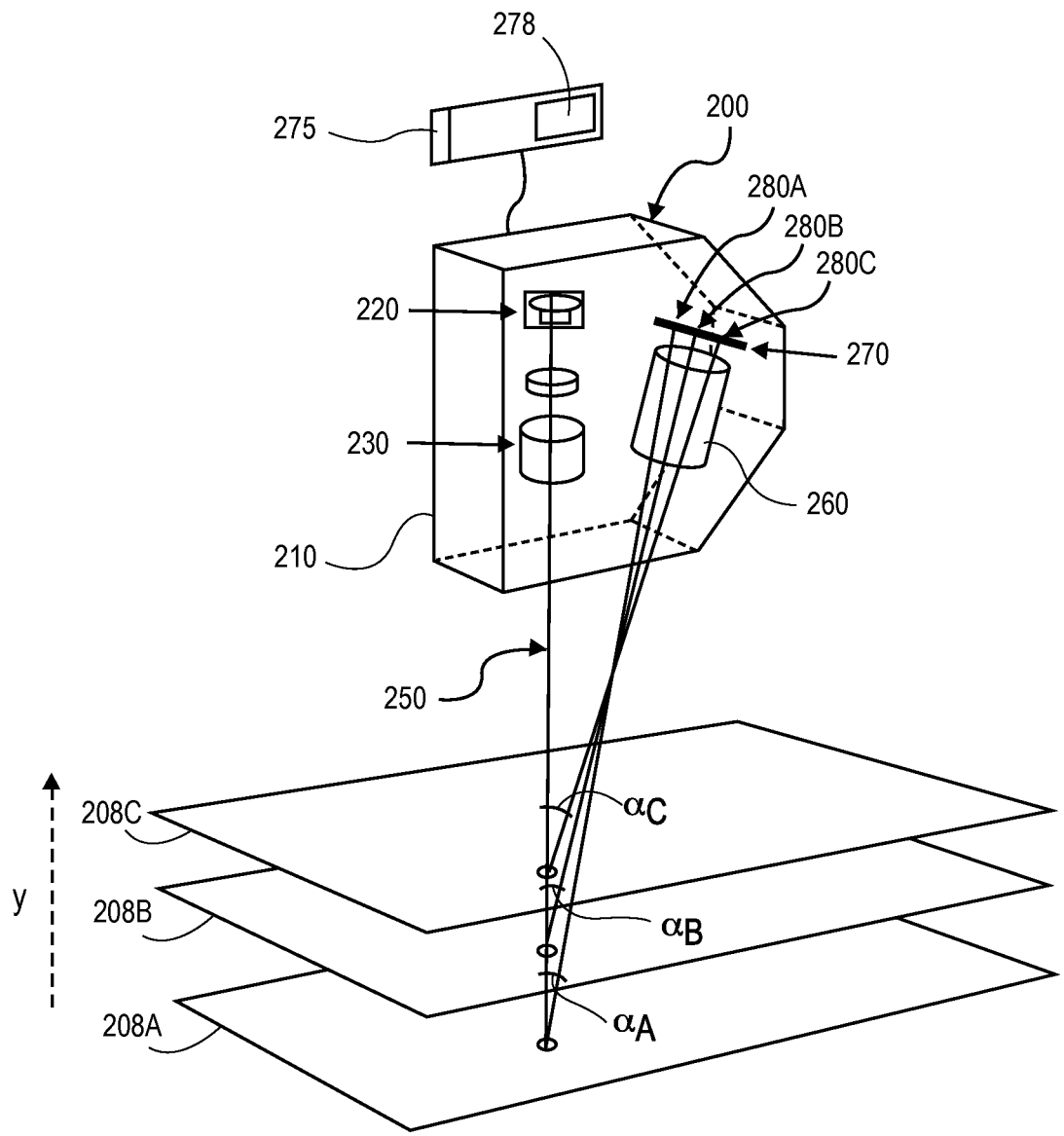
FIG. 2 shows a perspective top side view of an embodiment of an apparatus for measuring a thickness of a film or layer.

Referring to FIG. 2, a representative apparatus is shown for use in determining a thickness of a seed layer on a portion of a package surface, such as a BBUL package surface. It is appreciated that such apparatus may be applied for use in determining a thickness of a film or layer on an integrated circuit device surface (e.g., on a layer of a film added to a surface of a device) or a package surface.

FIG. 2 shows apparatus 200 that includes electromagnetic radiation source 220 (e.g., a laser) and detector 270 housed in housing 210. Specifically, in one embodiment, laser 220 is operable to emit electromagnetic radiation (light) in the form of a fixed beam at a wavelength on the order of 400 to 700 nanometers (e.g., 650 nanometers/visible light). The emitted light travels, in one embodiment, through transmitter lens 230 toward a target that is, for example, a package surface. A point of emission of the laser light is fixed (known). Upon hitting the target, the light is reflected back toward housing 210 and, specifically, toward detector 270. In one embodiment, reflected light is directed through receiver lens 260. Receiver lens 260 focuses the reflected light on detector 270 that is, for example, a charge coupled device (CCD) detector. When a surface of the target moves, a reflection angle of the reflected light changes and correspondingly a focus position on detector 270 shifts. A position that the light strikes detector 270 is known. A distance the target surface moves (e.g., in a y-direction as viewed) is computed from the reflection angle and a distance between the emitter (laser 220) and detector (detector 270). A reflection angle change in turn is calculated from a shift in the focus position.

FIG. 2, in one embodiment, shows emitted light 250 striking surface 208A of the target and being reflected toward detector 270. Light 250 is reflected at an angle $\alpha_A$. As the target shifts (e.g., moves in a y-direction toward housing 210), an angle of emitted light 250 likewise shifts. FIG. 2 shows target surface 208B displaced from target surface 208A and emitted light 250 striking target surface 208B at a reflection angle of $\alpha_B$. Further movement creates a further reflection angle change. FIG. 2 shows target surface 208C and emitted light 250 striking target surface 208C which is displaced from target surface 208B and the emitted light reflecting off target surface 208C at an angle $\alpha_C$.

In the above embodiment, detector 270 of, for example, a CCD detector 270 detects the individual reflected light (e.g., reflected light 280A off target surface 208A; reflected light 280B off target surface 208B; and reflected light 280C from target surface 208C). In one embodiment, a position of emitter (laser 220), detector 270 and a reflection angle (e.g., $\alpha_A$-$\alpha_C$) is transmitted to a memory 278. Controller 275 associated with system 200, in one embodiment, contains non-transitory, machine-readable instructions operable to access data from memory 278 and calculate a displacement of a target surface based on the data received. Representatively, the machine-readable instructions associated with controller 275 are operable to calculate a distance, between emitter 220 and target surface 208A based on data regarding the reflection angle, $\alpha_A$ and where reflected light 280A hits detector 270. Similarly, the instructions are operable to calculate a distance, between emitter 220 and target surface 208B based on data regarding the reflection angle, $\alpha_B$, and where the reflected light 280B hits detector 270. The machine-readable instructions are also operable to calculate a distance between target surface 208A and 208B, by, for example, subtracting the respective calculated distances. A difference between target surfaces, in one embodiment, is synonymous with a thickness of a layer added to a target surface (e.g., a thickness of a layer added to target surface 208A where the added layer has a surface equivalent to target surface 208B).

Figure 3:
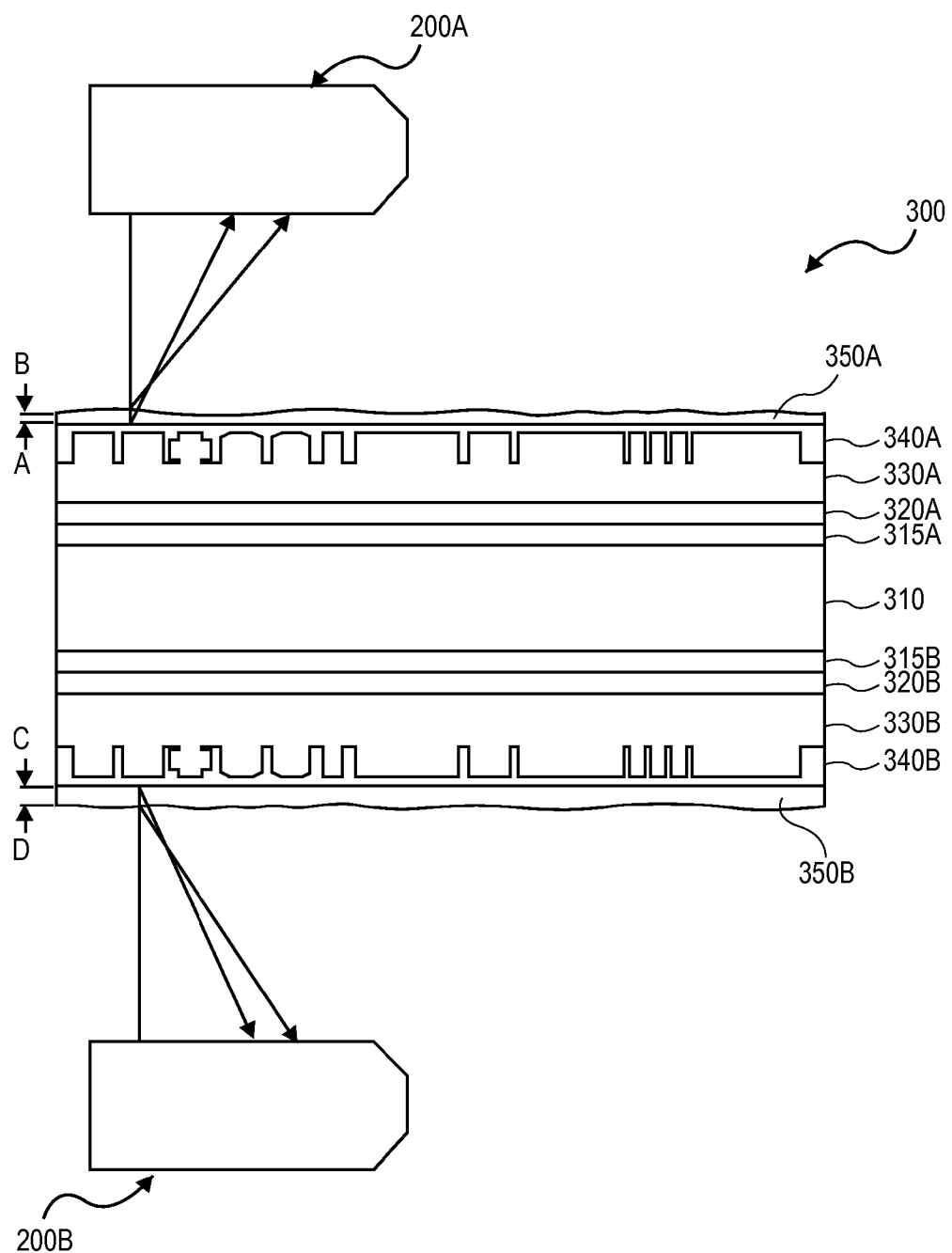
FIG. 3 shows a side view of a portion of BBUL package assembly including a portion of a first BBUL package on a first side of a sacrificial substrate and a portion of a second BBUL package on a second side of the sacrificial substrate.

FIG. 3 shows a side view of portions of BBUL packages during a BBUL assembly process. BBUL packages are generally formed on a sacrificial substrate. One technique is to form packages simultaneously on opposite sides of a sacrificial substrate. FIG. 3 shows a side view of a portion of a sacrificial substrate with representative alternating layers of dielectric material and conductive material formed thereon. Referring to FIG. 3, FIG. 3 shows sacrificial substrate 310 of, for example, a pre-peg material including opposing layers of copper foils 315A and 315B (e.g., each is representative of two layers of copper foil). Overlying the sacrificial substrate and copper foils on opposing sides of substrate 310 is dielectric layer 320A and dielectric layer 320B, respectively. Dielectric layer 320A and dielectric layer 320B are each, for example, an ABF material introduced on the substrate as a film. A representative thickness of dielectric layer 320A/320B is on order of 30 µm.

Overlying dielectric layer 320A and dielectric layer 320B in the embodiment shown in FIG. 3 is patterned conductive layer 330A and conductive layer 330B, respectively. In one embodiment, each conductive layer is introduced by a series of operations, including electrolessly seeding a surface of the respective dielectric layer (e.g., dielectric layer 320A, dielectric layer 320B); introducing and patterning a photoimageable material; electroplating a conductive material such as copper to exposed seed material; removing the photoimageable material; and removing unwanted seed material. A representative thickness of a conductive layer such as conductive layer 330A and conductive layer 330B is on the order of 10 µm to 15 µm.

Overlying conductive layer 330A and conductive layer 330B in the embodiment shown in FIG. 3 is dielectric layer 340A and dielectric layer 340B. Similar to dielectric layer 320A and dielectric layer 320B, dielectric layer 340A and dielectric layer 340B are each an ABF material introduced as a film.

Overlying dielectric layer 340A and dielectric layer 340B in the embodiment shown in FIG. 3 is seed material 350A and seed material 350B, respectively. In one embodiment, seed material 350A and seed material 350B is a conductive material such as copper introduced as a seed material as a platform onto which a conductive material may subsequently be plated. In one embodiment, seed material 350A and seed material 350B are each introduced on respective dielectric layers as a blanket electroless deposition having a thickness on the order of one micron. In the embodiment shown in FIG. 3, following the introduction of the seed material, a surface of the seed material is roughened by, for example, a roughening tool. In one embodiment, a target surface roughness is on the order of 200 nanometers (nm) to 400 nm.

As noted above, in one embodiment, it is desired to accurately measure a thickness of seed material 350A and seed material 350B. In one embodiment, a triangulation method may be employed, such as using the system described with reference to FIG. 2. FIG. 3 shows apparatus 200A positioned over a surface of dielectric layer 340A and apparatus 200B positioned over a surface of dielectric layer 340B. Each apparatus 200A/200B is similar to apparatus 200 in FIG. 2.

Figure 4:
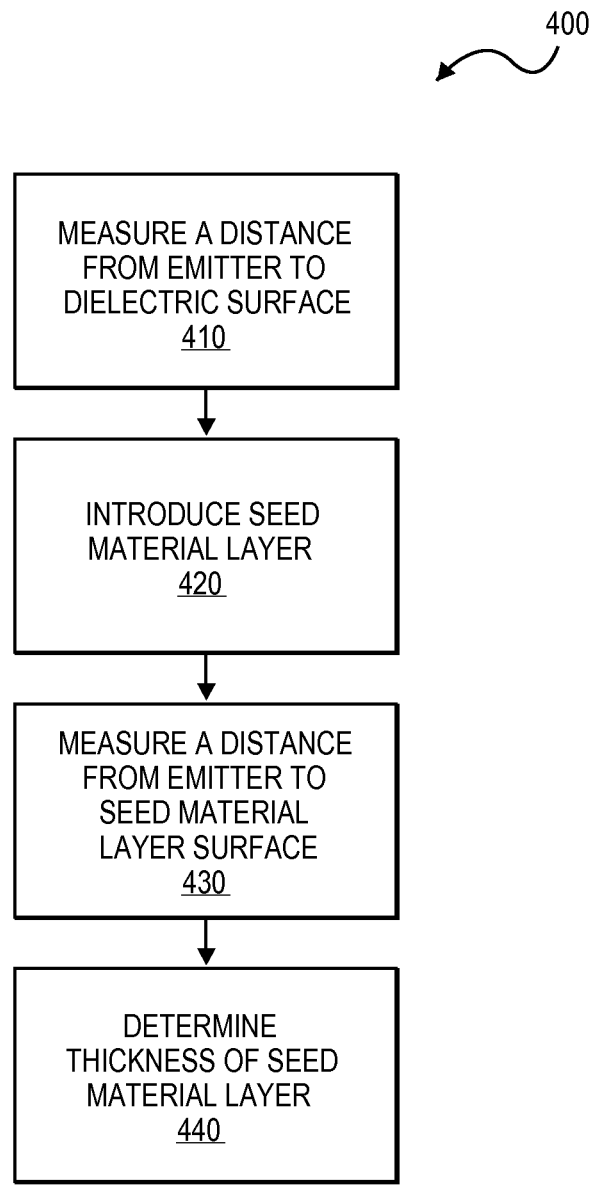
FIG. 4 is a flow chart of an embodiment of determining a thickness of a seed material layer.

FIG. 4 shows a method of determining a thickness of seed layer such as seed layer 350A and/or seed layer 350B in FIG. 3. In one embodiment, prior to an introduction of seed layer 350A/350B on structure 300 in FIG. 3, a distance, A/C, from an emitter in apparatus 200A/200B and a surface of dielectric layer 340A/340B is determined using triangulation as described above (block 410). The distance, A/C, is stored in memory associated with apparatus 200A/200B. Next, seed material is introduced, such as a copper seed material introduced by an electroless deposition process to form seed layer 350A/350B (block 420). Next, seed layer 350A/350B is optionally roughened.

Following the introduction and optional roughening of a surface of seed layer 350A/350B, a distance, B/D, from an emitter of apparatus 200A/200B and a surface of the seed layer is determined using a triangulation method (block 430). To determine a thickness of seed layer 350A/350B, a difference between a distance measurement to a surface of dielectric layer 340A/340B (A/C) and a distance from the emitter to a surface of seed layer 350A/350B (B/D) is determined and the difference is equal to a thickness of the seed layer (block 440). In one embodiment, involving dual-side build-up such as shown in FIG. 3, it may be desirable to determine a relative thickness of a seed layer as opposed to an absolute thickness of a single side. A representative relative thickness measurement using the example of FIG. 3 (C+D)−(A+B).

As noted above, in one embodiment, a surface of a seed layer (e.g., seed layer 350A/350B in FIG. 3) is roughened. Using a laser with adjustable power as a light source in a triangulation method allows high resolution measurement on a rough surface. Representatively, for a roughened surface, an intensity of emitted radiation from a laser is increased relative to that necessary for a smooth surface. Representatively of a laser light source is 10 mm from a surface of a seed layer, a laser light source would be selected to have a 50 nm resolution to distinguish between a distance of 0.65 µm and 0.70 µm (difference of 0.05 µm or 50 nm). Such intensity may be in a form of emission power and/or emission time (e.g., increase power and emission time for roughen surface).

In one embodiment, when measuring a thickness of a seed layer on a BBUL panel using a beam of laser light having a spot size of 1 µm, a panel is divided into quarter areas, such as 100 millimeter (mm)×100 mm. In each quarter area, thickness measurements are taken in smaller areas of, for example, 1 mm×1 mm, are selected and a designated number of measurements are performed and averaged.

In the above embodiment, a method for determining a thickness of an electroless seed layer in the package is described. It is appreciated that triangulation method such as described and the employed system may be used for determining the thickness of other layers or films in both integrated circuit devices and packaging processes.

Figure 5:
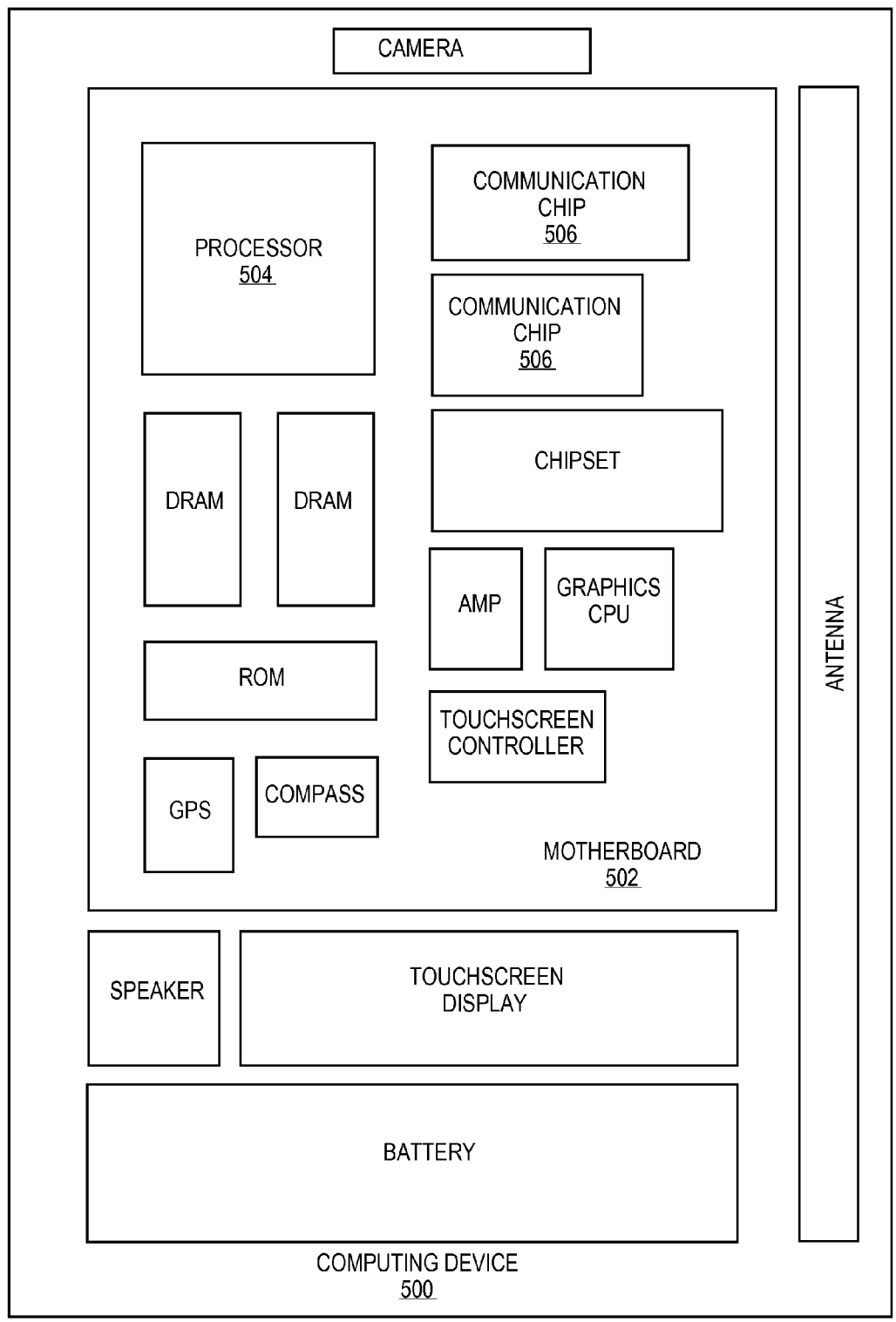
FIG. 5 illustrates computing device in accordance with one implementation of the invention.

FIG. 5 illustrates a computing device 500 in accordance with one implementation. The computing device 500 houses board 502. Board 502 may include a number of components, including but not limited to processor 504 and at least one communication chip 506. Processor 504 is physically and electrically connected to board 502. In some implementations the at least one communication chip 506 is also physically and electrically connected to board 502. In further implementations, communication chip 506 is part of processor 504.

Depending on its applications, computing device 500 may include other components that may or may not be physically and electrically connected to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the package formed in accordance with embodiment described above utilizes BBUL technology. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In accordance with another implementation, a package including a communication chip incorporates one or more capacitors such as described above.

In further implementations, another component housed within computing device 500 may contain a microelectronic package that may incorporate one or more capacitors in or on the package.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
transmitting light from a first fixed point to a surface of an integrated circuit substrate or a portion of an integrated circuit package;
detecting a reflection of the transmitter light at a second point;
measuring a first reflection angle of the transmitted light between the first point and the second point;
determining a first distance between the first point and the surface based on the first reflection angle;
introducing a material onto the surface;
transmitting light from the first position to the surface of the introduced material;
measuring a second reflection angle of the transmitted light from the surface of the introduced material between the first point and the second point;
determining a second distance between the first position and the surface of the introduced material based on the second reflection angle; and
determining a thickness of the introduced material by subtracting the second distance from the first distance.

2. The method of claim 1, wherein the surface comprises a dielectric film.

3. The method of claim 2, wherein prior to determining the first distance, the method comprises roughening the surface.

4. The method of claim 3, wherein roughening comprises forming a surface roughness on the order of 200 nanometers to 400 nanometers.

5. The method of claim 2, wherein the introduced material comprises a copper seed layer.

6. The method of claim 1, wherein the surface is a dielectric film on a portion of a build-up package and the introduced material comprises a copper seed layer.

7. The method of claim 6, wherein introducing a material comprises electroless depositing the material.

8. A method comprising:
introducing a dielectric film as a build-up layer on a package panel;
transmitting light from a first fixed point to a surface of the dielectric film;
measuring a first reflection angle of the transmitted light between the first point and a first detection point;
determining a first distance between the first point and the surface based on the first reflection angle;
introducing a material onto the surface;
transmitting light from the first point to the surface of the introduced material;
measuring a second reflection angle of the transmitted light from the surface of the introduced material between the first point and a second point;
determining a second distance between the first point and the surface of the introduced material based on the second reflection angle; and
determining a thickness of the introduced material by subtracting the second distance from the first distance.

9. The method of claim 8, wherein prior to determining the first distance, the method comprises roughening the surface.

10. The method of claim 9, wherein roughening comprises forming a surface roughness on the order of 200 nanometers to 400 nanometers.

11. The method of claim 9, wherein the introduced material comprises a copper seed layer.

12. The method of claim 11, wherein introducing a material comprises electroless depositing the material.

13. A method comprising:
   transmitting light from a first fixed point to a surface on a package panel;
   measuring a first reflection angle of the transmitted light between the first point and a first detection point on a detector;
   determining a first distance between the first point and the surface based on the first reflection angle;
   introducing a seed layer onto the surface;
   transmitting light from the first point to the surface of the seed layer;
   measuring a second reflection angle of the transmitted light to the surface of the seed layer, the second reflection angle being between the first point and a second point on the detector;
   determining a second distance between the first point and the surface of the introduced material based on the second reflection angle; and
   determining a thickness of the seed layer by subtracting the second distance from the first distance.

14. The method of claim 13, wherein prior to determining the first distance, the method comprises roughening the surface.

15. The method of claim 14, wherein roughening comprises forming a surface roughness on the order of 200 nanometers to 400 nanometers.

16. The method of claim 13, wherein introducing a material comprises electroless depositing the material.

* * * * *